United States Patent [19]
Staab et al.

[11] Patent Number: 5,688,127
[45] Date of Patent: Nov. 18, 1997

[54] UNIVERSAL CONTACTOR SYSTEM FOR TESTING BALL GRID ARRAY (BGA) DEVICES ON MULTIPLE HANDLERS AND METHOD THEREFOR

[75] Inventors: Craig C. Staab, Mesa; David P. Olson, Tempe, both of Ariz.

[73] Assignee: VLSI Technology, Inc., San Jose, Calif.

[21] Appl. No.: 505,863

[22] Filed: Jul. 24, 1995

[51] Int. Cl.[6] .................................................. H01R 9/09
[52] U.S. Cl. ..................................... 439/66; 439/71
[58] Field of Search .......................... 439/45, 66, 69, 439/71; 324/158, 158 F

[56] References Cited

U.S. PATENT DOCUMENTS

| | | | |
|---|---|---|---|
| 4,508,405 | 4/1985 | Damon et al. | 439/66 X |
| 4,528,500 | 7/1985 | Lightbody et al. | 439/66 X |
| 5,127,837 | 7/1992 | Shah et al. | 439/71 |
| 5,171,290 | 12/1992 | Olla et al. | 439/71 |
| 5,174,763 | 12/1992 | Wilson | 439/66 |
| 5,399,982 | 3/1995 | Driller et al. | 439/66 X |

FOREIGN PATENT DOCUMENTS 8600173  1/1986  WIPO ........................ 439/66

*Primary Examiner*—Jes F. Pascua
*Attorney, Agent, or Firm*—Harry M. Weiss; Jeffrey D. Moy; Harry M. Weiss & Associates, P.C.

[57] ABSTRACT

The present invention relates to a universal contactor system for testing multiple size BGA devices on multiple types of testing equipment. The universal contactor system is comprised of a plurality of pogo pin which provide a connection between the BGA device to be tested and a DUT (Device Under Test) board. A contactor block having a plurality of apertures therethrough is used for holding the plurality of pogo pins. A guide plate having a center opening is coupled to the contactor block. The center opening in the guide plate is used for aligning the BGA device to be tested on the contactor block. The guide plate may be replaced with guide plates having a larger or smaller opening to align BGA devices of a larger or smaller size on the contactor block.

11 Claims, 2 Drawing Sheets

UNIVERSAL CONTACTOR SYSTEM FOR TESTING BALL GRID ARRAY (BGA) DEVICES ON MULTIPLE HANDLERS AND METHOD THEREFOR

BACKGROUND OF THE INVENTION

1. Field of the Invention

This invention relates generally to contactor systems for testing integrated circuits and, more specifically, to a universal contactor system for testing BGA (Ball Grid Array) devices of various sizes on multiple pieces of testing equipment and method therefor.

2. Description of the Prior Art

A BGA device needs to be tested to ensure high quality of the finished product. Currently, in order to test a BGA device, the contactor elements of the BGA device are inserted into a contactor plate having a plurality of sockets. The contactor plate is coupled to a DUT (Device Under Test) board which is coupled to a testing machine. The DUT board is, essentially, a printed circuit board that completes an electrical circuit between the BGA contactor elements via the contactor plate and the testing machine. In order to test the BGA device, the testing machine sends signals to and receives signals from the BGA device via the electrical conductor paths provided by the contactor plate and the DUT board.

While current contactor plates do work, there exists several problems with these contactor plates. First, many current contactor plates are comprised of a plurality of sockets for receiving the contactor elements of the BGA device. The sockets of the contactor plate tend to wear out over time thereby providing poor contact for electrical testing of the BGA device. Second, current contactor plates can only be used on certain types of testing equipment. As such, different contactor plates are required for each different type of testing equipment. Third, current contactor plates can only accommodate BGA device packages having a particular array type or a particular ball pitch. Therefore, it is necessary to have a different contactor plate for different size BGA device packages. Fourth, currently, in order to test a BGA device, a receptacle has to be soldered to a load board. The contactor plate, upon which the BGA device is coupled, would then be connected to the receptacle on the load board. The receptacle provides an additional connection point which interferes with the electrical continuity for testing the BGA device.

Therefore, a need existed to provide a contactor plate that would provide reliable electrical contact for testing BGA devices. The contactor plate must be capable of being used on different types of testing and handling equipment. The contactor plate must also be adaptable to allow the contactor plate to handle a variety of different size BGA devices.

SUMMARY OF THE INVENTION

In accordance with one embodiment of the present invention, it is an object of this invention to provide an improved contactor system and method therefor for testing BGA devices.

It is another object of the present invention to provide an improved contactor system and method therefor that can be used to test BGA devices of various sizes.

It is still another object of the present invention to provide an improved contactor system and method therefor that can be used for testing BGA devices on multiple types of testing equipment.

It is still another object of the present invention to provide an improved contactor system and method therefor that provides a reliable electrical connection for testing BGA devices.

BRIEF DESCRIPTION OF THE PREFERRED EMBODIMENTS

In accordance with one embodiment of the present invention, a universal contactor system for testing BGA (Ball Grid Array) devices of various sizes on multiple handlers is disclosed. The universal contactor system is comprised of a plurality of pogo pins for providing a connection with the BGA device to be tested when the BGA device is placed on the universal contactor system thereby compressing the plurality of pogo pins. The plurality of pogo pins is held in a contactor block having a plurality of apertures therethrough. A guide plate is coupled to the contactor block for aligning the BGA device to be tested on the contactor block.

In accordance with another embodiment of the present invention, a method for providing a universal contactor system for testing BGA devices of various sizes on multiple handlers is disclosed. The method is comprised of the steps of: providing a plurality of pogo pins for connecting with the BGA device to be tested when the BGA device is placed on the universal contactor system thereby compressing the plurality of pogo pins; providing contactor block having a plurality of apertures therethrough for holding the plurality of pogo pins within the contactor block; and providing guide plate coupled to the contactor block for aligning the BGA device to be tested on the contactor block.

The foregoing and other objects, features, and advantages of the invention will be apparent from the following, more particular, description of the preferred embodiments of the invention, as illustrated in the accompanying drawing.

DETAILED DESCRIPTION OF THE PREFERRED EMBODIMENTS

Figure 1:
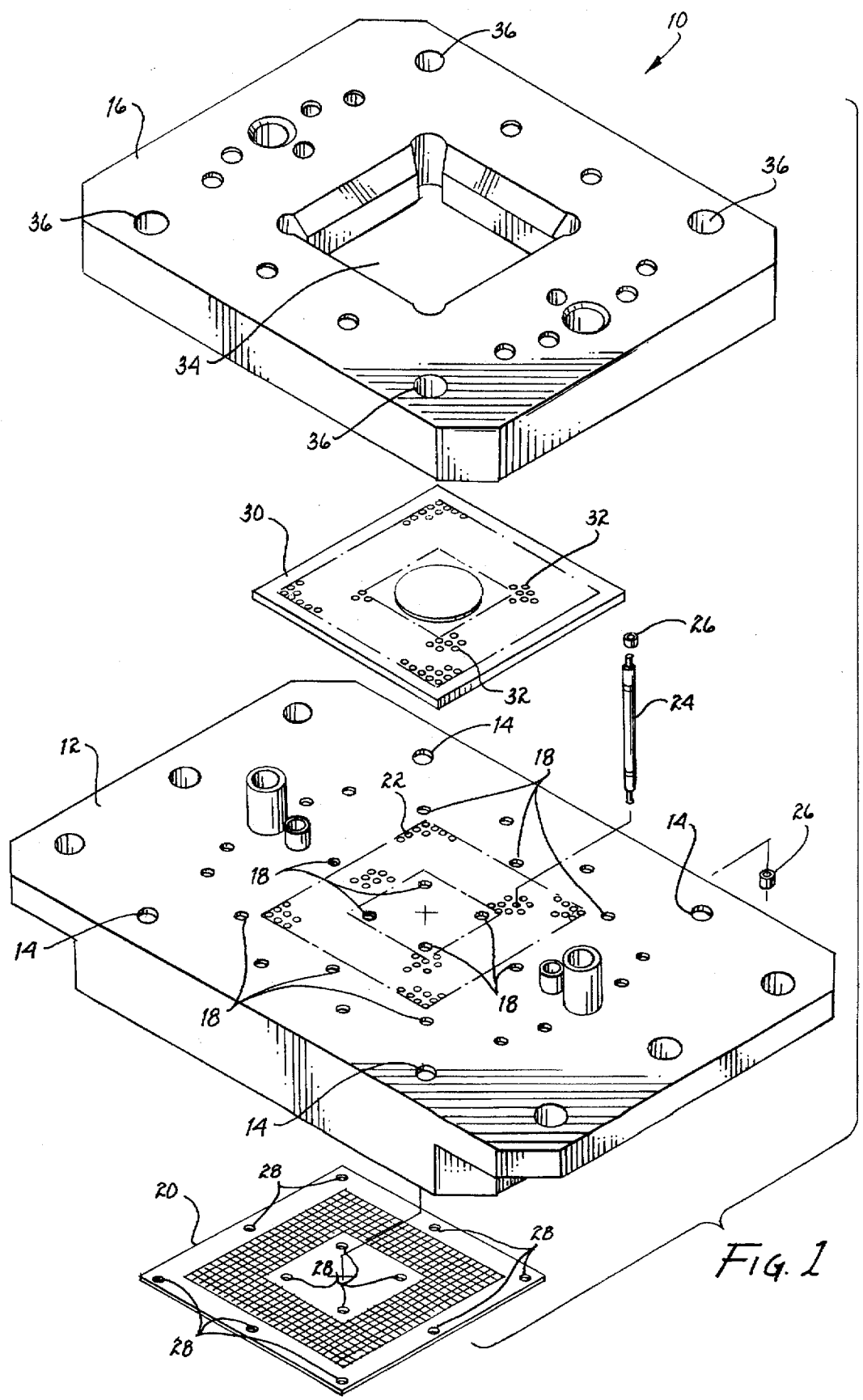
FIG. 1 is an exploded perspective view of the universal contactor system of the present invention.

Referring to FIG. 1, a universal BGA contactor system 10 (hereinafter contactor system 10) is shown. The contactor system 10 is comprised of a contactor block 12. The contactor block 12 has a plurality of bolt holes 14 to permit coupling of a guide plate 16 to the contactor block 12 via a plurality of bolts (not shown). The contactor block 12 also has a plurality of smaller bolt holes 18 to permit coupling of a bottom keeper plate 20 to the contactor block 12. Located in a center portion of the contactor block 12 is a plurality of apertures 22. The apertures are drilled through the contactor block 12. The apertures are generally cylindrical in shape and are wide enough to permit the insertion of a pogo pin 24 within the contactor block 12.

Each pogo pin 24 is isolated from the other pogo pins 24 by an air gap within the aperture 22 and a pair of isolation rings 26. One isolation ring 26 is placed on a top portion of the pogo pin 24 and the other isolation ring is placed on a lower portion of the pogo pin 24. The pair of isolation rings 26 prevent the pogo pins 24 from coming into contact with the contactor block 12 when the pogo pins 24 are positioned within the contactor block 12.

A bottom keeper plate 20 is coupled to a bottom portion of the contactor block 12. The bottom keeper plate 20 has a plurality of bolt holes 28. The bolt holes 28 are of the same diameter as the bolt holes 18 of the contactor block 12. The bolt holes 28 are aligned with the bolt holes 18 of the contactor block 12 in order to allow the bottom keeper plate 20 to be coupled to the contactor block 12 by a plurality of bolts (not shown). When coupled to the contactor block 12, the bottom keeper plate 20 prevents the pogo pins 24 from falling out of the contactor block 12. In accordance with the preferred embodiment of the present invention, the bottom keeper plate 20 is constructed out of an electrically nonconductive material such as plastic.

A top keeper plate 30 is coupled to a top portion of the contactor block 12. The top keeper plate 30 has a plurality of apertures 32 each have an opening which is wide enough to permit the insertion of a contact element extending from the BGA device being tested. The top keeper plate 30 is aligned and coupled to the contactor block 12 so as to have the center of each of the plurality of apertures 32 aligned on the same vertical axis as one of the plurality of pogo pins 24. While the plurality of apertures 32 are wide enough to allow the top keeper plate 30 to receive the contact elements extending from a BGA device, the apertures 32 are not wide enough to allow the pogo pins 24 to be removed from the contactor block 12. Thus, when coupled to the contactor block 12, the top keeper plate 30 holds the pogo pins 24 within the contactor block 12. The top keeper plate 30 is of a suitable thickness so as to limit the compression of the plurality of pogo pins 24 when a BGA device is placed on the contactor system 10 to be tested. In accordance with the preferred embodiment of the present invention, the top keeper plate 30 is constructed out of an electrically nonconductive material such as plastic.

A guide plate 16 is also coupled to the contactor block 12. When coupled to the contactor block 12, the guide plate 16 holds the top keeper plate 30 in position so as to have the plurality of apertures 32 and the pogo pins 24 in proper alignment. The guide plate 16 has a central opening 34 which is large enough to expose all of the plurality of apertures 32 of the top keeper plate 30. However, the opening 34 is not large enough to allow the removal of the top keeper plate 30. The guide plate 16 also has a plurality of bolt holes 36 for allowing the guide plate 16 to be bolted to the contactor block 12 by a plurality of bolts (not shown). When coupled to the contactor block 12, the guide plate 16 holds the top keeper plate 30 in position and is used to align the BGA device to be tested on the contactor block 12.

Figure 2:
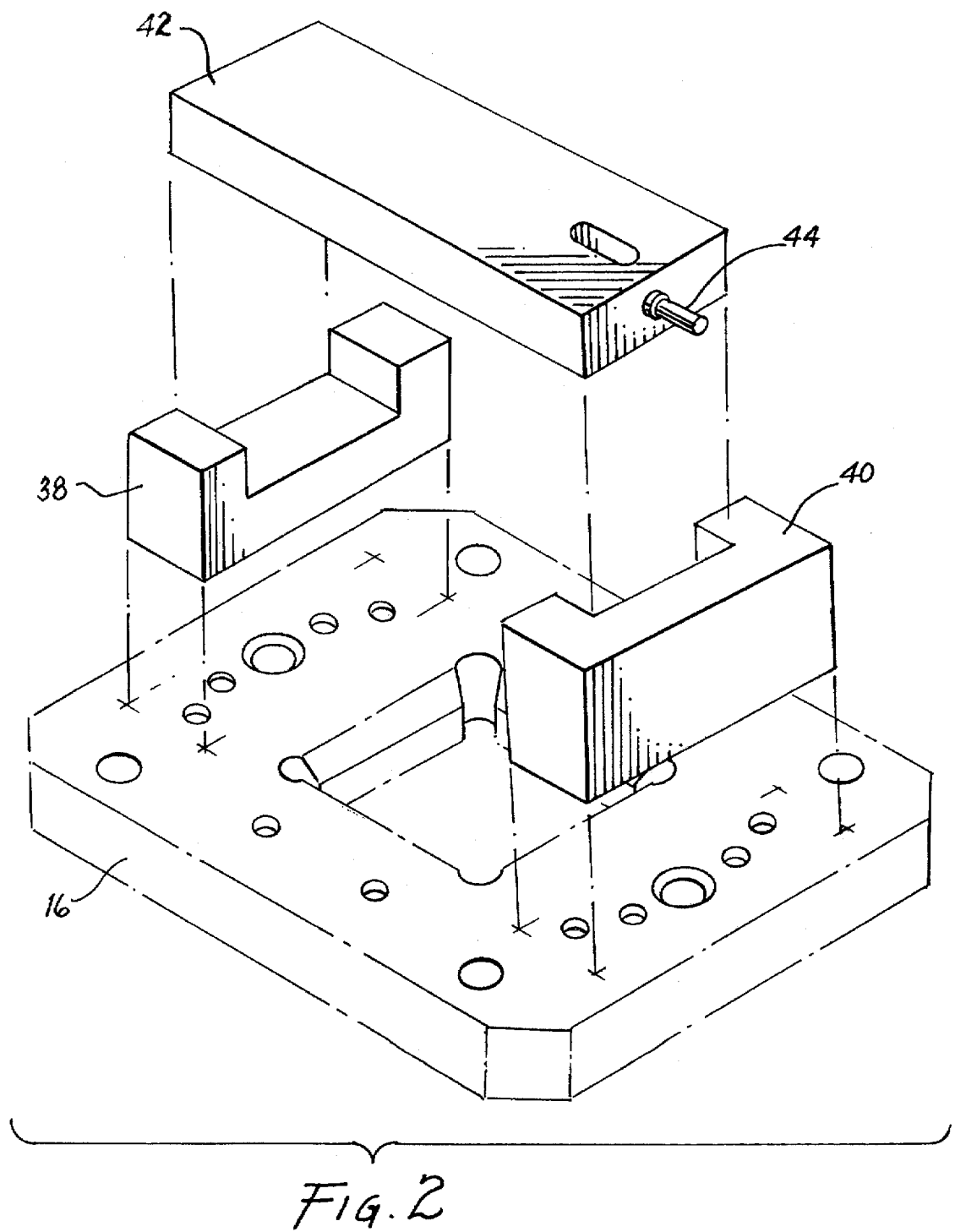
FIG. 2 is an exploded perspective view of a locking device of the universal contactor system shown in FIG. 1.

Referring to FIG. 2, a first support 38 and a second support 40 are coupled to the guide plate 16. One end of a holding plate 42 is pivotally coupled to the first support 38. When a BGA device is placed in the contactor system 10, the holding plate 42 is lowered and the BGA device is held in the contactor system 10. A locking device 44 is coupled to a second end of the holding plate 42. The locking device 44 can lock the holding plate 42 to the second support 40 in order to hold the BGA device in the contactor system 10 during testing of the BGA device.

OPERATION

In order to test a BGA device, the contactor system 10 must be coupled to a DUT board (not shown). The contactor system 10 can be directly coupled to the DUT board. This eliminates two (2) connection points since a receptacle does not have to be soldered to the DUT board. By removing two connection points, electrical reliability and continuity increases since two electrical connection points have been removed. The BGA device is then placed in the contactor system 10. The guide plate 16 helps align the BGA device so that the contact elements extending from the BGA device can be inserted in the apertures 32 of the top keeper plate 30. Once the BGA device is placed in the contactor system 10, the holding plate 42 can be lowered and locked thereby holding the BGA device in the contactor system 10 during testing of the BGA device.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A universal contactor system for testing BGA (Ball Grid Array) devices of various sizes on multiple handlers comprising, in combination:

a plurality of pogo pins for providing a connection with each BGA device to be tested when said BGA device is placed in said universal contactor system thereby compressing said plurality of pogo pins;

a contactor block having a plurality of apertures therethrough for holding said plurality of pogo pins within said contactor block;

a guide plate coupled to said contactor block and having an aperture therethrough for aligning said BGA device to be tested on said contactor block;

a bottom keeper plate coupled to a bottom portion of said contactor block for holding said pogo pins within said contactor block; and a top keeper plate coupled to a top portion of said contactor block for holding said pogo pins within said contactor block, said top keeper plate having an array of apertures for receiving all of a plurality of contact elements extending from said BGA device being tested and is of suitable thickness to limit an amount of insertion of said BGA device being tested thereby limiting compression of said pogo pins.

2. A universal contactor system in accordance with claim 1 further comprising isolation rings coupled to a top portion and a bottom portion of each of said plurality of pogo pins for ensuring said plurality of pogo pins do not come in contact with said contactor block when said plurality of pogo pins are positioned within said contactor block.

3. A universal contactor system in accordance with claim 1 further comprising a BGA device holding device coupled to said guide plate for holding said BGA device in said universal contactor system during testing of said BGA device.

4. A universal contactor system in accordance with claim 3 wherein said BGA device holding device further comprises:

a first support block coupled to said guide plate for pivotally holding one end of a holding plate;

holding plate having one end pivotally coupled to said first support block for holding said BGA device in said universal contactor system when said BGA device is being tested; and a second support block coupled to said guide plate for holding a second end of said holding plate when said holding plate is lowered and said BGA device is being tested.

5. A universal contactor system in accordance with claim 4 wherein said holding plate further comprises a locking device coupled to said second end of said holding plate for locking said holding plate to said second support block when said BGA device is being tested.

6. A universal contactor system for testing BGA devices of various sizes on multiple handlers comprising, in combination:

a plurality of pogo pins for providing a connection with each BGA device to be tested when said BGA device is placed in said universal contactor system thereby compressing said plurality of pogo pins;

a contactor block having a plurality of apertures therethrough for holding said plurality of pogo pins within said contactor block;

a guide plate coupled to said contactor block and having an aperture therethrough for aligning said BGA device to be tested on said contactor block;

a bottom keeper plate coupled to a bottom portion of said contactor block for holding said pogo pins within said contactor block;

a top keeper plate coupled to a top portion of said contactor block for holding said pogo pins within said contactor block, said top keeper plate having an array of apertures for receiving all of a plurality of contact elements extending from said BGA device being tested and is of suitable thickness to limit an amount of insertion of said BGA device being tested thereby limiting compression of said pogo pins;

isolation ring coupled to a top portion and a bottom portion of each of said plurality of pogo pins for ensuring said plurality of pogo pins do not come in contact with said contactor block when said plurality of pogo pins are positioned within said contactor block;

a BGA device holding device coupled to said guide plate for holding said BGA device in said universal contactor system during testing of said BGA device, said BGA device holding device comprising:

a first support block coupled to said guide plate for pivotally holding one end of a holding plate;

holding plate having one end pivotally coupled to said first support block for holding said BGA device in said universal contactor system when said BGA device is being tested;

a second support block coupled to said guide plate for holding a second end of said holding plate when said holding plate is lowered and said BGA device is being tested; and a locking device coupled to said second end of said holding plate for locking said holding plate to said second support block when said BGA device is being tested.

7. A method of providing a universal contactor system for testing BGA (Ball Grid Array) devices of various sizes on multiple handlers comprising the steps of:

providing a plurality of pogo pins for providing a connection with each BGA device to be tested when said BGA device is placed in said universal contactor system thereby compressing said plurality of pogo pins;

providing a contactor block having a plurality of apertures therethrough for holding said plurality of pogo pins within said contactor block;

providing a guide plate coupled to said contactor block and having an aperture therethrough for aligning said BGA device to be tested on said contactor block;

providing a bottom keeper plate coupled to a bottom portion of said contactor block for holding said pogo pins within said contactor block;

providing a top keeper plate coupled to a top portion of said contactor block for holding said pogo pins within said contactor block, said top keeper plate having an array of apertures for receiving all of a plurality of contact elements extending from said BGA device being tested and is of suitable thickness to limit an amount of insertion of said BGA device being tested thereby limiting compression of said pogo pins.

8. The method of claim 7 further comprising the step of providing isolation rings coupled to a top portion and a bottom portion of each of said plurality of pogo pins for ensuring said plurality of pogo pins do not come in contact with said contactor block when said plurality of pogo pins are positioned within said contactor block.

9. The method of claim 7 further comprising the step of providing a BGA device holding device coupled to said guide plate for holding said BGA device in said universal contactor system during testing of said BGA device.

10. The method of claim 9 wherein said step of providing a BGA device holding device further comprises the steps of:

providing a first support block coupled to said guide plate for pivotally holding one end of a holding plate;

providing a holding plate having one end pivotally coupled to said first support block for holding said BGA device in said universal contactor system when said BGA device is being tested; and providing a second support block coupled to said guide plate for holding a second end of said holding plate when said holding plate is lowered and said BGA device is being tested.

11. The method of claim 10 wherein said step of providing a holding plate further comprises the step of providing a locking device coupled to said second end of said holding plate for locking said holding plate to said second support block when said BGA device is being tested.

* * * * *